United States Patent
Rong et al.

(10) Patent No.: US 7,478,294 B2
(45) Date of Patent: Jan. 13, 2009

(54) TIME CONTROLLABLE SENSING SCHEME FOR SENSE AMPLIFIER IN MEMORY IC TEST

(75) Inventors: Bor-Doou Rong, Chupei (TW); Shi-Huei Liu, Jhubei (TW)

(73) Assignee: Etron Technology, Inc., Hsin-Chu (TW)

( * ) Notice: Subject to any disclaimer, the term of this patent is extended or adjusted under 35 U.S.C. 154(b) by 281 days.

(21) Appl. No.: 11/152,476

(22) Filed: Jun. 14, 2005

(65) Prior Publication Data

US 2007/0011508 A1 Jan. 11, 2007

(51) Int. Cl.
G01R 31/28 (2006.01)

(52) U.S. Cl. .................. 714/724; 365/201; 365/203; 365/223

(58) Field of Classification Search ............... None
See application file for complete search history.

(56) References Cited

U.S. PATENT DOCUMENTS

| | | | | |
|---|---|---|---|---|
| 4,860,261 A | * | 8/1989 | Kreifels et al. | 365/185.18 |
| 5,077,738 A | * | 12/1991 | Larsen et al. | 714/42 |
| 5,428,621 A | * | 6/1995 | Mehrotra et al. | 714/721 |
| 5,659,550 A | * | 8/1997 | Mehrotra et al. | 714/721 |
| 5,894,445 A | | 4/1999 | Kobayashi | 365/208 |
| 6,118,713 A | | 9/2000 | Raad | 365/201 |
| 6,639,861 B2 | * | 10/2003 | Stief et al. | 365/201 |
| 6,643,203 B2 | * | 11/2003 | Oikawa et al. | 365/207 |
| 6,826,079 B2 | | 11/2004 | Tran | 365/171 |
| 7,154,808 B2 | * | 12/2006 | Shim | 365/230.04 |
| 2002/0033723 A1 | * | 3/2002 | Lee et al. | 327/201 |
| 2002/0040989 A1 | * | 4/2002 | Otsuka et al. | 257/296 |
| 2007/0011508 A1 | * | 1/2007 | Rong et al. | 714/718 |

* cited by examiner

*Primary Examiner*—John P Trimmings
*Assistant Examiner*—Steven D Radosevich
(74) *Attorney, Agent, or Firm*—Saile Ackerman LLC; Stephen B. Ackerman

(57) ABSTRACT

A test method is described in which a signal from a tester enters a memory chip or memory module into a special test mode. The special test mode allows leakage defects connected to bit lines to be detected using bit line sense amplifiers. A first test command is issued by a tester, after which a word line is activated. The tester issues a second test command, delayed from the first test command, during the special test mode to turn-on the memory bit line sense amplifiers. The delayed second test command allows sufficient time for the leakage from defects at the crossing of the bit lines and the word line to charge capacitance of the bit lines and allow detection by the sense amplifiers.

13 Claims, 4 Drawing Sheets

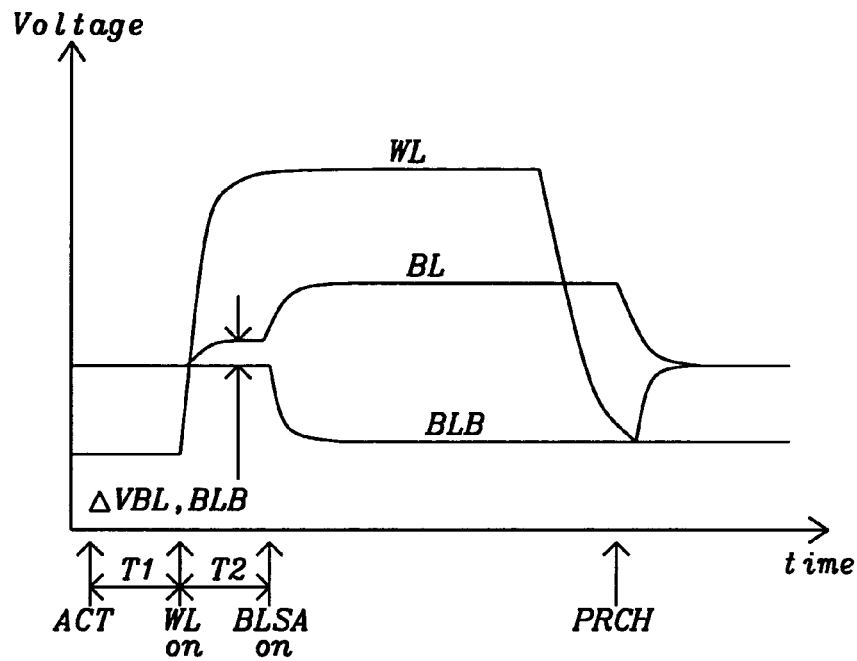
FIG. 1 — Prior Art
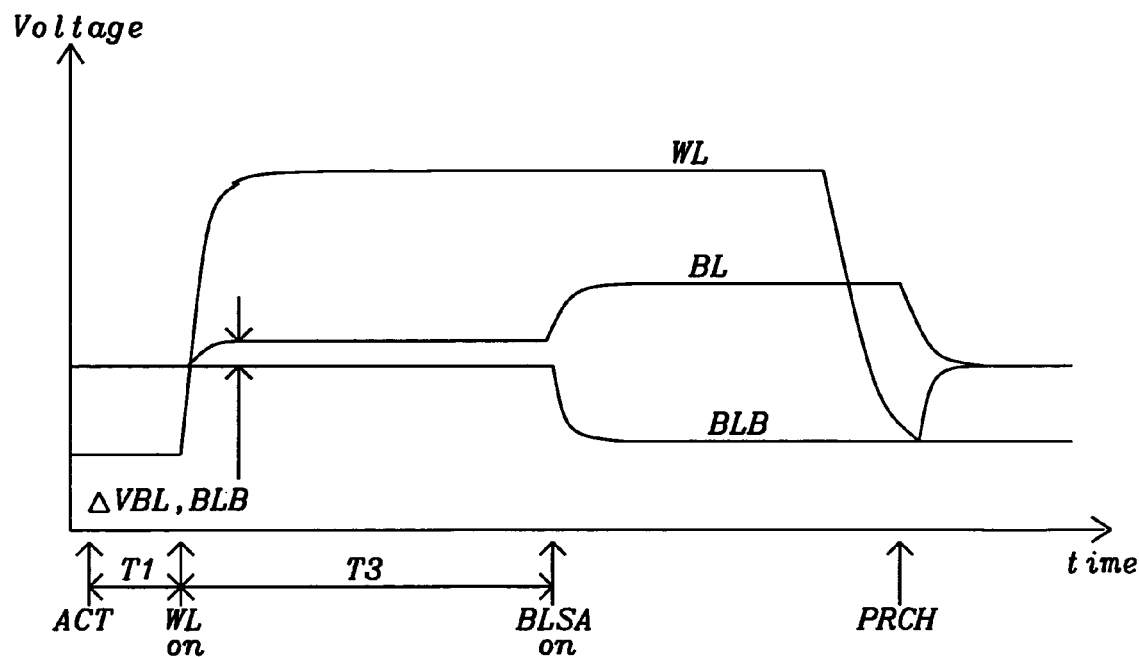
FIG. 2 — Prior Art

TIME CONTROLLABLE SENSING SCHEME FOR SENSE AMPLIFIER IN MEMORY IC TEST

BACKGROUND OF THE INVENTION

1. Field of Invention

The present invention is related to semiconductor memory and in particular to testing memory bit lines in an IC test.

2. Description of Related Art

The testing of integrated circuits and in particular semiconductor memory chips presents a challenge to detect defects that prevent proper operation of the memory chips. Bit lines connecting columns of memory cells are orthogonal to word lines connecting rows of the memory cells. At each crossing of the bit lines and the word lines there is an opportunity for defects located at the crossing to produce a leakage current between the word lines and the bit lines. A method for detecting the leakage current entails using sense amplifiers connected to the bit lines. In order to allow the sense amplifiers to measure the leakage requires a time delay to allow the leakage current to charge the bit line capacitance. An RC (resistor capacitor) network is integrated into the memory chip to allow the memory chip for the purpose of providing sufficient time delay to permit the charging of the bit line capacitance so that the sense amplifiers can measure the defect. The capacitor of the RC network used only in test mode is relatively large and affects the size of the memory chip.

In U.S. Pat. No. 6,826,079 (Tran) a method and system is directed to minimizing leakage current within an array of memory cells in which a differential sense amplifier differentiates the sensed current from a read operation from a reference value. U.S. Pat. No. 6,639,861 (Stief et al.) is directed to using a control circuit to switch to a non-conducting state in which the leakage behavior of a bit line can be read out during read out of a data signal. In U.S. Pat. No. 6,118,713 (Raad) a memory stress test is directed to writing a logic bit in a weakened state whereby the logic bit is read back out to stress the memory and identify weak sense amplifiers and memory cells. U.S. Pat. No. 5,894,445 (Kobyashi), is directed to a semiconductor memory in which a bit line control circuit reads data from a cell to detect faults.

In FIG. 1 is shown a signal diagram of prior art for the normal activation of a memory chip to read data from memory cells. At a constant time delay T1 after a row-active command (ACT) a word line WL is turned on. Upon turning on the word line the differential voltage $\Delta V_{BL,BLB}$ between the bit line BL and bit line bar BLB begins to be established. After a constant time delay T2 the bit line sense amplifier BLSA is turned on, and the bit line BL and bit line bar BLB are read by the bit line sense amplifier. The delay times T1 and T2 are relatively short having similar value and created by an on-chip RC network. When the word line is turned off a precharge command PRCH is issued to precharge the bit lines and the bit lines return to a quiescent state.

FIG. 2 shows a signal diagram of prior art where a time delay T3 is used during chip and module test to delay turning on the bit line sense amplifier BLSA. The time delay T3 is long and requires a large capacitor in an RC network, which occupies a considerable amount of the semiconductor memory chip real estate. The length of the time delay is established to allow leakage from defects to charge the bit lines BL and BLB sufficiently to allow a measurement of the leakage by the bit line sense amplifier BLSA. The size of the capacitor necessary to produce the time delay T3 is large and substantially increases the size of the memory chip.

SUMMARY OF THE INVENTION

It is an objective of the present invention to measure bit line leakage resulting from defects in a semiconductor memory.

It is further an objective of the present invention to control the measurement with a time delayed signal from a tester.

It is still further an objective of the present invention that the timed delayed signal provide a delay starting from when a word line is turned-on and extending for a period of time, which is sufficient to allow bit line leakage to charge the bit lines prior to turning on the bit line sense amplifier, and for which the leakage defect can be detected by sense amplifiers.

In the present invention a tester command to activate a word line precedes the turning on of a word line by a short first delay developed by an on chip RC network. When the word line is turned on, the bit lines (bit line and bit line bar) develop a differential voltage. Any bit line leakage resulting from defects begins to charge the bit lines and affects the differential bit line voltage. At the end of a second time delay controlled by the tester, a second tester command is issued turning on the bit line sense amplifiers to measure bit lines BL and BLB. The second time delay is relatively long and sufficient in length to allow leakage defects to charge the bit lines and allow the sense amplifiers to measure the results of the defect. If the sense amplifier measurement determines that the results to be different than expected values, the memory chip is determined to be defective.

BRIEF DESCRIPTION OF THE DRAWINGS

This invention will be described with reference to the accompanying drawings, wherein:

FIG. 1 is a signal diagram of prior art for the normal operation of a semiconductor memory chip;

FIG. 2 is a signal diagram of prior art depicting the test operation for measuring bit line leakage using an RC network internal to the semiconductor memory chip;

DETAILED DESCRIPTION OF THE PREFERRED EMBODIMENT

Figure 3A:
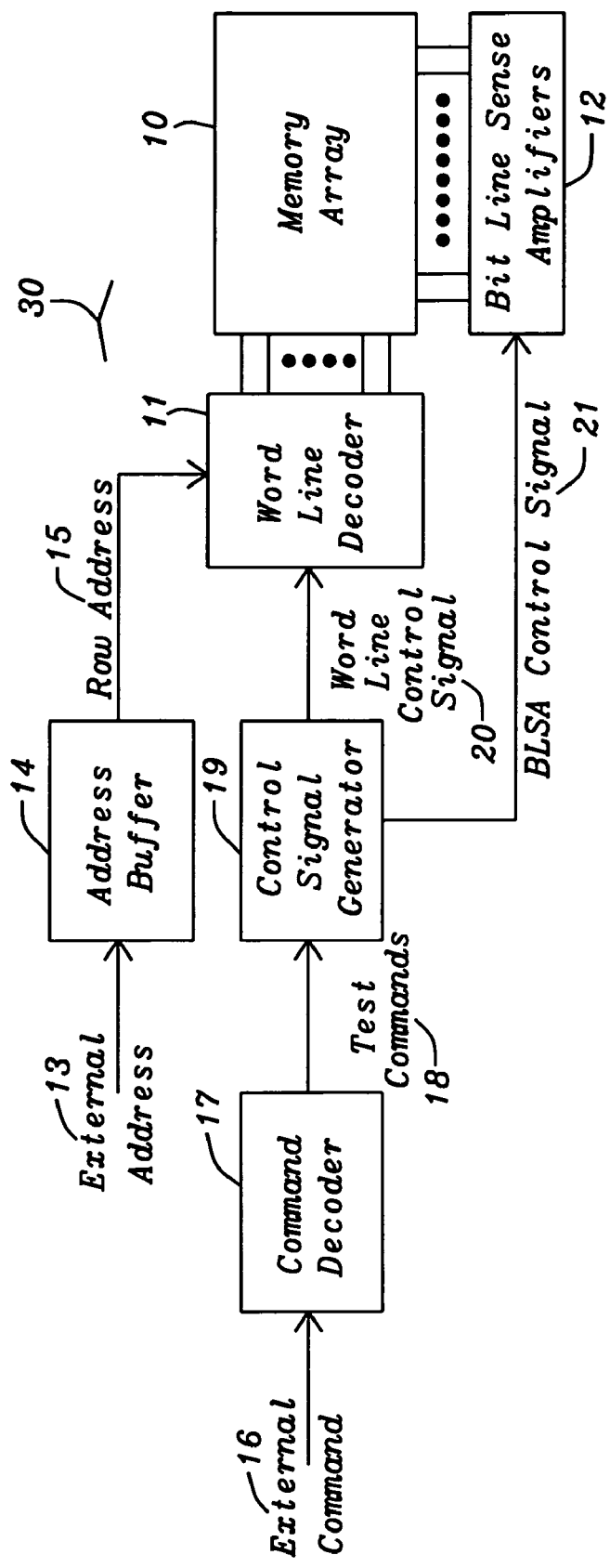
FIG. 3A is a block diagram a memory chip of the present invention for controlling the testing of bit line leakage using an external stimulus from a tester.

In FIG. 3A is shown a block diagram of a memory chip 30 of the present invention. A memory array 10 is formed from rows and columns of memory cells. A word line decoder 11 selects a row of the memory cells from which data is read out to the bit line sense amplifiers (BLSA) 12. An address externally formed 13, in a tester for example, is coupled to an address buffer 14 from which a row address 15 is connected to the word line decoder for selection of a particular word line. An external command line 16 is coupled to a command decoder 17, which couples commands to the control signal generator 19. The control signal generator 19 produces a word line control signal 20, which is coupled to the word line decoder 11, and a BLSA control signal 21, which is coupled to the bit line sense amplifiers 12.

When the memory chip 30 is being tested, the external command 16 in a form of a special sequence of data bits from a tester is coupled to the command decoder 17 to place the memory chip 30 into a test mode. While the memory chip is in the test mode the tester issues by way of the external command 16 a first of two test commands 18. The first test command is a row-active command, which is communicated to the word line decoder 11 through the control signal generator 19. The first test command activates the row of memory cells that are being addressed by the external address 13 through the address buffer 14. At a delayed time from the first test command, the tester issues a second test command 18, which in the test mode is interpreted as bit line sense amplifier on and the control generator 19 couples the BLSA control signal 21 to the bit line sense amplifiers 12 to turn on the sense amplifiers. When the sense amplifiers are turned on, the stored charge accumulated on bit lines, between the first and the second test commands, is measured by the sense amplifiers 12.

It should be noted that in normal operation of the memory chip, the second test command is not available. Instead a single row-active command initiates the activation of a word line, and after a memory chip internal time delay the sense amplifiers are turned on as shown in FIG. 1 with the BLSA control signal 21.

Figure 3B:
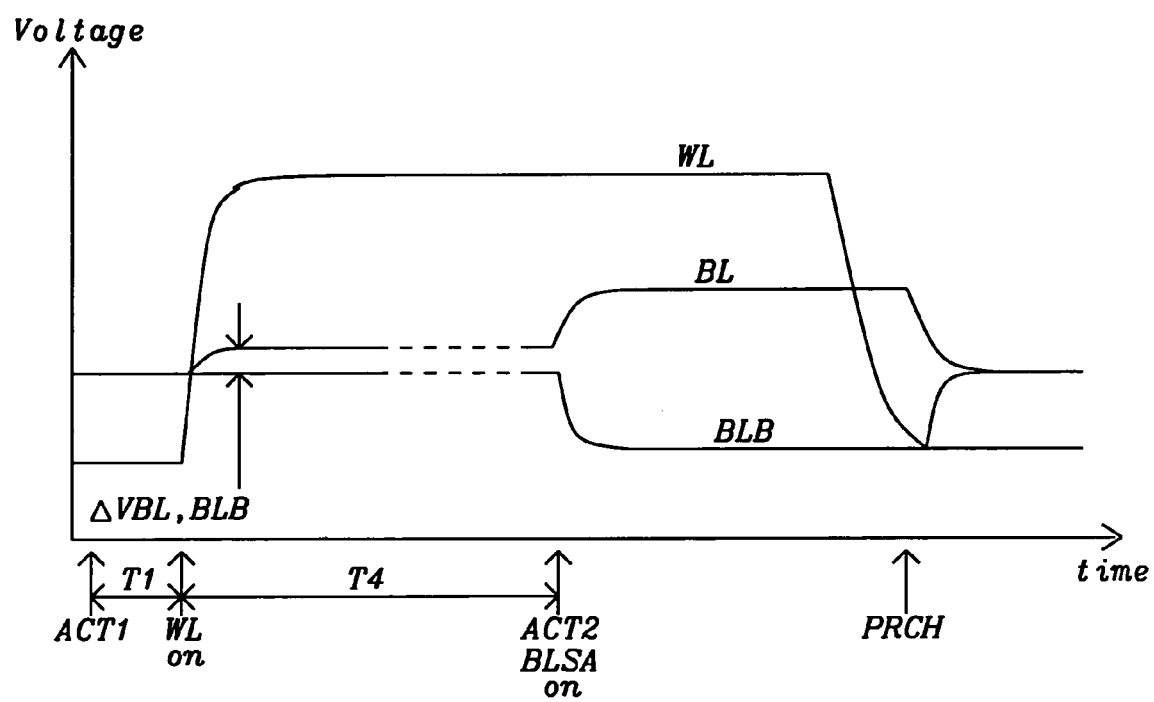
FIG. 3B is a signal diagram of the present invention showing an external timing control to delay the turn-on of the sense amplifiers to measure bit line leakage.

In FIG. 3B is shown a signal diagram of the present invention for a memory chip that has been placed into a special test mode to allow a tester to control timing of row-active commands to test for leakage current on bit lines. A first test command ACT1 is initiated by a tester, and after a short time delay T1 a word line WL is turned on. The bit lines BL and BLB begin to develop a differential voltage $\Delta V_{BL,BLB}$, which includes the effects of any leakage current onto the bit lines BL and BLB through defects connected to the bit lines. The leakage defects are primarily between the word line WL and the bit lines BL and BLB located at the crossing of the word line and the bit lines. After a relatively long time delay T4, the tester issues a second test command ACT2 to activate the bit line sense amplifiers BLSA. The bit line sense amplifiers BLSA are turned on by the ACT2 command to measure the accumulated charge on the bit lines BL and BLB. Each pair of bit lines BL and BLB associated with the word line WL are measured by the sense amplifiers BLSA, and the memory chip, or module, found to have a bit line charge, which is greater that a predetermined value, is determined to be defective and discarded. After the word line is turned off the bit lines are precharged PRCH and return to a quiescent state. While in the special test mode, the memory chip is tested for leakage from each word line by addressing each word line separately and applying the ACT1 command followed by a delayed ACT2 command and measuring the accumulated charge on the bit lines BL and BLB. The use of the tester to issue the second test command, delayed from the first test command eliminates the need for a large on chip capacitance as needed with the prior art of FIG. 2 to create the time delay T3.

Figure 4:
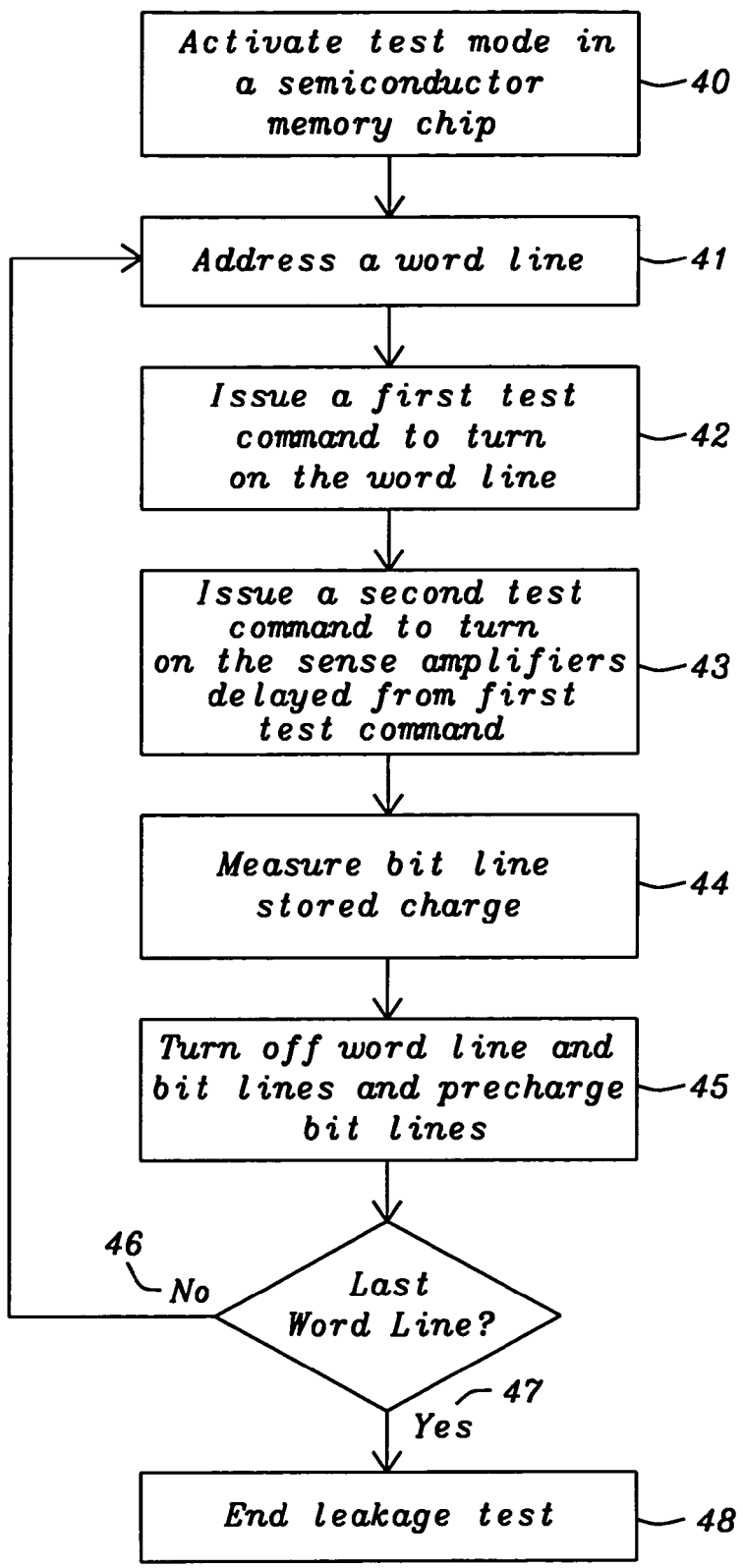
FIG. 4 is a flow diagram of the present invention demonstrating the testing for charge on bit lines resulting from leakage defects.

In FIG. 4 is shown a method for the testing of bit lines for charge resulting from leakage current. The leakage current is primarily between word lines and bit lines and occurs at the physical crossing of the word lines and bit lines. A signal is connected to a command decoder (FIG. 3A) by a tester to activate a special test mode in the memory chip 40. The tester connects a word line address to the address buffer 41, and issues a first test command to turn on the addressed word line 42. After a time delay T1+T4 (FIG. 3B) the tester issues a second test command that turns on the sense amplifiers of the memory chip 43. The issuance of a second testcommand is only available in test mode and is used to allow the delay of the turning on of the sense amplifiers. The delay allows any leakage between the word line and the bit lines to sufficiently charge the bit lines so that the sense amplifiers are able to detect the results of the leakage. After the time delay T1+T4, the charge stored on the bit lines is measured 44, and memory chips containing a charge exceeding a predefined limit are rejected. The addressed word line is turned off along with the sense amplifiers and each bit line is pre-charged 45. If the last word line has not been turned on to test for leakage to the bit lines 46, a next word line is addressed 41 and the process steps 42 to 46 are repeated. When the last word line has been addressed and the bit lines tested for leakage, the leakage test is ended 48.

While the invention has been particularly shown and described with reference to preferred embodiments thereof, it will be understood by those skilled in the art that various changes in form and details may be made without departing from the spirit and scope of the invention.

What is claimed is:

1. A method to detect bit line leakage, comprising the following steps:
   a) activating a test mode in a semiconductor memory chip using a unique code formed by a sequence of data bits applied to a command decoder within the memory chip, whereby said memory chip conditioned to receive a first test command followed by a second test command coupled from a tester to said command decoder;
   b) addressing a word line;
   c) issuing said first test command, a word line activate command, from the tester to said command decoder of the memory chip to turn on said word line;
   d) waiting a predetermined amount of time to allow leakage current from said word line through defects in said memory chip to charge bit lines;
   e) issuing said second test command from the tester to said command decoder, wherein the second test command interpreted by the command decoder during said test mode as a command to turn on bit line sense amplifiers (BLSA);
   f) measuring charge accumulated on bit lines during said predetermined amount of time by detecting said charge with said BLSA and comparing said charge to a predetermined value to detect leakage from said word line;
   g) turning off said word line, pre-charging the bit lines and turning off the bit lines; and
   h) repeating steps b) through g) until all word lines have been addressed.

2. The method of claim 1, wherein issuing said first test command turns on said word line after a short fixed time delay, controlled by a RC network within said semiconductor memory chip.

3. The method of claim 1, wherein waiting said predetermined amount of time is controlled by the tester of said semiconductor memory chip.

4. The method of claim 1, wherein issuing said second test command initiates a control signal from a control signal generator connected to the command decoder to turn on said bit line sense amplifiers.

5. The method of claim 4, wherein said second test command is only available in said test mode.

6. A semiconductor memory chip with a test mode to detect bit line leakage, comprising:
   a) a means for entering a test mode in a semiconductor memory chip using a unique sequential code applied to a command decoder to enter test mode, whereby the memory chip is conditioned to receive a first test command followed by a second test command coupled from a tester to the command decoder of the memory chip;

b) a means for issuing said first test command to initiate a turning on of an addressed word line in said memory chip;

c) a means for issuing said second test command after a predetermined amount of time to turn on bit line sense amplifiers; and d) a means to determine leakage present on bit lines from said word line by comparing a bit line voltage in said sense amplifiers to a predetermined value.

7. The semiconductor memory chip of claim 6, wherein said means for issuing said first test command is followed by turning on said addressed word line after a time delay controlled by said memory chip.

8. The semiconductor memory chip of claim 6, wherein said means for issuing the second test command is delayed from the turning on of said addressed word line by a tester, whereby said leakage from defects charge said bit lines intersecting said addressed word line.

9. A memory chip test for bit line leakage, comprising:
   a) a memory chip controlled by a tester, wherein said tester issues a unique sequential code to a command decoder to enter test mode, whereby said memory chip conditioned to receive a first test command followed by a second test command connected to the command decoder of the memory chip;
   b) a row of cells and a row address;
   c) said first test command coupled to the command decoder of said memory chip from said tester to activate a word line of said row of cells corresponding to said row address; and
   d) said second test command coupled to the command decoder of said memory chip from said tester to activate bit line sense amplifiers (BLSA) connected to bit lines coupled to said row of cells to determine leakage current from said word line to said bit lines.

10. The memory chip test of claim 9, wherein said tester controls said memory chip in a test mode whereby said second test command is used to activate said BLSA.

11. The memory chip test of claim 9, wherein said second test command is delayed from said first test command by the tester for a sufficient amount of time to allow bit line leakage current to charge said bit lines and allow said BLSA to measure said leakage.

12. The memory chip test of claim 11, wherein said memory chip has a size not affected by a large timing network required to delay the second test command from the first test command.

13. The memory chip test of claim 9, wherein said memory chip further comprises:
   a) a command decoder;
   b) an address buffer;
   c) a control signal generator;
   d) said tester couples an enter test mode command to the command decoder to place said memory chip into said test mode, which allows the first test command issued by the tester to the command decoder to cause a word line control signal be coupled from the control signal generator to a word line decoder to activate a word line connecting said row of cells having a row address entered into said address buffer, and which allows the second test command delayed from the first test command and connected to the command decoder issued by said tester to cause a bit line sense amplifier control signal be coupled from the control signal generator to the BLSA to activate the bit line sense amplifiers to measure leakage onto the bit lines from said word line.

* * * * *